United States Patent [19]
Kondo et al.

[11] Patent Number: 5,302,910
[45] Date of Patent: Apr. 12, 1994

[54] FM DETECTOR CIRCUIT WITH ERROR VOLTAGE APPLIED TO PHASE SHIFTING CIRCUIT

[75] Inventors: Hiroshi Kondo; Isao Fukai, both of Tsurugashima, Japan

[73] Assignee: Toko, Inc., Tokyo, Japan

[21] Appl. No.: 995,035

[22] Filed: Dec. 22, 1992

[30] Foreign Application Priority Data
Dec. 27, 1991 [JP] Japan .................. 3-360276

[51] Int. Cl.⁵ .................................................. H03D 3/00
[52] U.S. Cl. ................................... 329/336; 455/214; 455/337
[58] Field of Search ............... 329/336, 337; 455/214, 455/337

[56] References Cited

U.S. PATENT DOCUMENTS 3,792,367 2/1974 Fleischer et al. ............... 330/98
4,451,792 5/1984 Gay ............................... 329/336 X

OTHER PUBLICATIONS

IEEE Transactions on Circuit Theory, Lee C. Thomas, "The Biquad: Part 1—Some Practical Design Considerations", May 1971, vol. CT-18, No. 3, pp. 350-357.
IEEE Transactions on Circuit Theory, Lee C. Thomas, "The Biquad: Part 2—A Multipurpose Active Filtering System", May 1971, vol. CT-18, No. 3, pp. 358-361.

*Primary Examiner*—David Mis

[57] ABSTRACT

In an FM detector circuit, a phase-shifting circuit is constituted by integrating circuits each consisting of a transconductance amplifier and capacitor. The phase-shifting circuit being arranged to cause limiter signal to be phase-shifted by 90 degrees at center frequency. A multiplying circuit is provided which is arranged to be provided with said limiter signal and output of said phase-shifting circuit, thereby effecting phase-detection of said limiter signal. Further, an error amplifier is provided which is supplied with a smoothed version of detection output derived from said multiplying circuit. The arrangement is made such that output of the error amplifier is applied to the transconductance amplifiers constituting said phase-shifting circuit.

2 Claims, 4 Drawing Sheets

FM DETECTOR CIRCUIT WITH ERROR VOLTAGE APPLIED TO PHASE SHIFTING CIRCUIT

BACKGROUND OF THE INVENTION

1. Field of the Invention

The present invention relates to an FM detector circuit using a phase-shifting circuit which can be readily constructed in the form of an integrated semiconductor circuit and requires no adjustment.

2. Description of the Prior Art

FIG. 1 of the accompanying drawings is a circuit diagram showing an example of FM detector circuit comprising a conventional quadrature detector circuit, which comprises a phase-shifting circuit 20 for causing the phase of a limiter signal (IF signal) derived from a limiter circuit to be shifted by 90 degrees at the center frequency thereof, and a multiplier circuit 21 adapted for phase-detecting the limiter signal. Limiter signal derived from the limiter circuit is applied directly to one of the input terminals of the multiplier circuit 21, and a signal derived from the phase-shifting circuit 20 is passed to the other input terminal of the multiplier circuit 21; thus, the limiter signal is phase-detected in the multiplier circuit 21 so that FM detection output is provided.

The quadrature detector circuit is an FM detector circuit which is relatively well adapted to be constructed in the form of an integrated semiconductor circuit. However, the multiplier circuit 21 is constructed in the form of an integrated semiconductor circuit, but the phase-shifting circuit 20 comprises a capacitor, coil and so forth, i.e., it is an external component which is mounted onto a printed circuit board.

Further, adjustment operation for adjusting the phase-shift characteristic of the phase-shifting circuit 20 is effected by adjusting the resonance frequency of the phase-shifting circuit 20 by changing the inductance value of the coil by moving the magnetic core thereof for each tuning frequency.

In the FM detector circuit of FIG. 1, the multiplying circuit 21 is constructed in the form of an integrated semiconductor circuit, but the phase-shifting circuit 20 is an external component which is mounted onto a printed circuit board, as mentioned above. Hence, the FM detector circuit shown in FIG. 1 is disadvantageous in that it requires an increased number of parts and thus the manufacturing cost is increased. Another disadvantage is that it requires such troublesome adjustment operation that adjustment is effected for each tuning frequency as mentioned above.

SUMMARY OF THE INVENTION

Accordingly, it is an object of the present invention to provide an FM detector circuit comprising a phase-shifting circuit which can readily be constructed in the form of an integrated semiconductor circuit and requires no adjustment, thereby eliminating the above-mentioned disadvantages of the prior art arrangement.

Briefly stated, the FM detector circuit according to the present invention includes a phase-shifting circuit which comprises a circuit portion consisting only of an integrator to which a limiter signal is applied, and a band pass filter circuit portion consisting other integrators. The present FM detector circuit is arranged such that the output thereof is smoothed out and then supplied to an error amplifier, and an error voltage derived therefrom is applied to transconductance amplifiers employed in the phase-shifting circuit so that the DC level of FM detection output is controlled to be constant all the time with respect to the center frequency independently of the tuning frequency. Thus, according to the present invention, the phase-shifting circuit can be arranged to require no adjustment, and also it can readily be constructed in the form of an integrated semiconductor circuit.

More particularly, the FM detector circuit according to the present invention includes a phase-shifting circuit which comprises a plurality of integrating circuits each consisting of a transconductance amplifier and capacitor. Specifically, the phase-shifting circuit comprises a circuit portion consisting only of a single integrator to which a limiter signal is applied, and a band pass filter circuit portion consisting other integrators, as mentioned above. The arrangement is made such that in the circuit portion consisting only of the single integrator, the limiter signal is phase-shifted by 90 degrees, and in the band pass filter circuit portion, the center frequency is adjusted to set up the tuning frequency. Furthermore, the transconductance of each of the transconductance amplifiers used in the phase-shifting circuit is controlled on the basis of error voltage (current) which is derived from the error amplifier by smoothing out FM detection output, and thus the gain is adjusted so that the tuning frequency is set up. In this way, according to the present invention, it is possible to eliminate the necessity to adjust the phase-shifting circuit for each tuning frequency so that the phase is shifted substantially by 90 degrees at the center frequency as is the case with the prior art. That is, the phase-shifting circuit can advantageously be arranged to require no adjustment.

Furthermore, with the FM detector circuit according to the present invention, the phase-shifting circuit, which has conventionally been composed of coils, capacitors, and so forth, can be constructed in the form of an integrated semiconductor circuit so that the entire FM detector circuit arrangement can be constructed in the form of an integrated semiconductor circuit, thereby making it possible to reduce the number of parts and manufacturing cost.

Other objects, features and advantages of the present invention will become apparent from the ensuing description taken in conjunction with the accompanying drawings.

DESCRIPTION OF THE PREFERRED EMBODIMENTS

Figure 1:
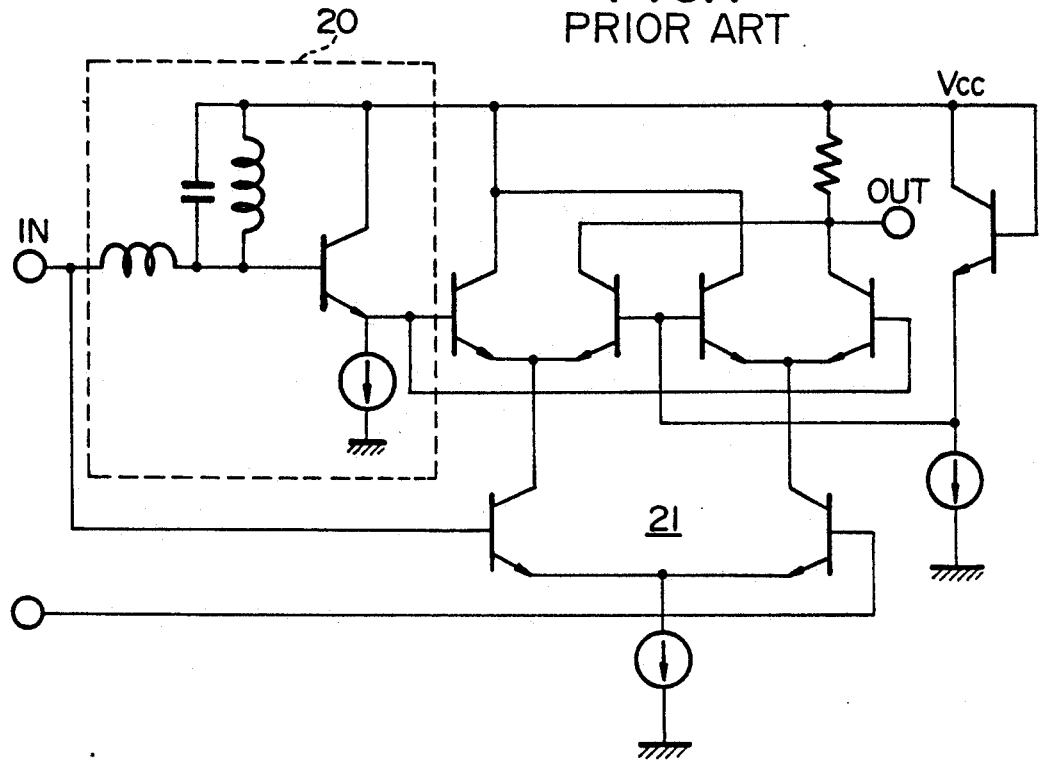
FIG. 1 is a circuit diagram useful for explaining a conventional phase-shifting circuit.
Figure 2:
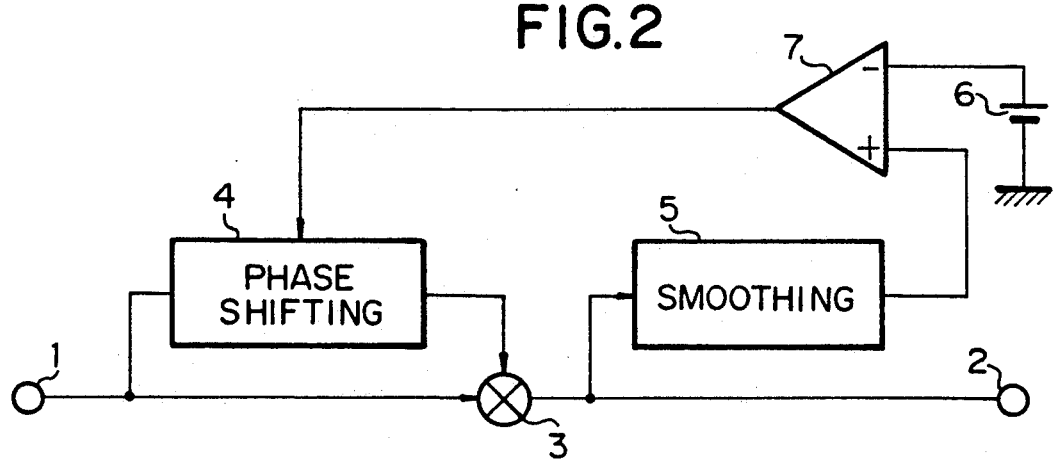
FIG. 2 is a block diagram showing the FM detector circuit according to an embodiment of the present invention.
Figure 3:
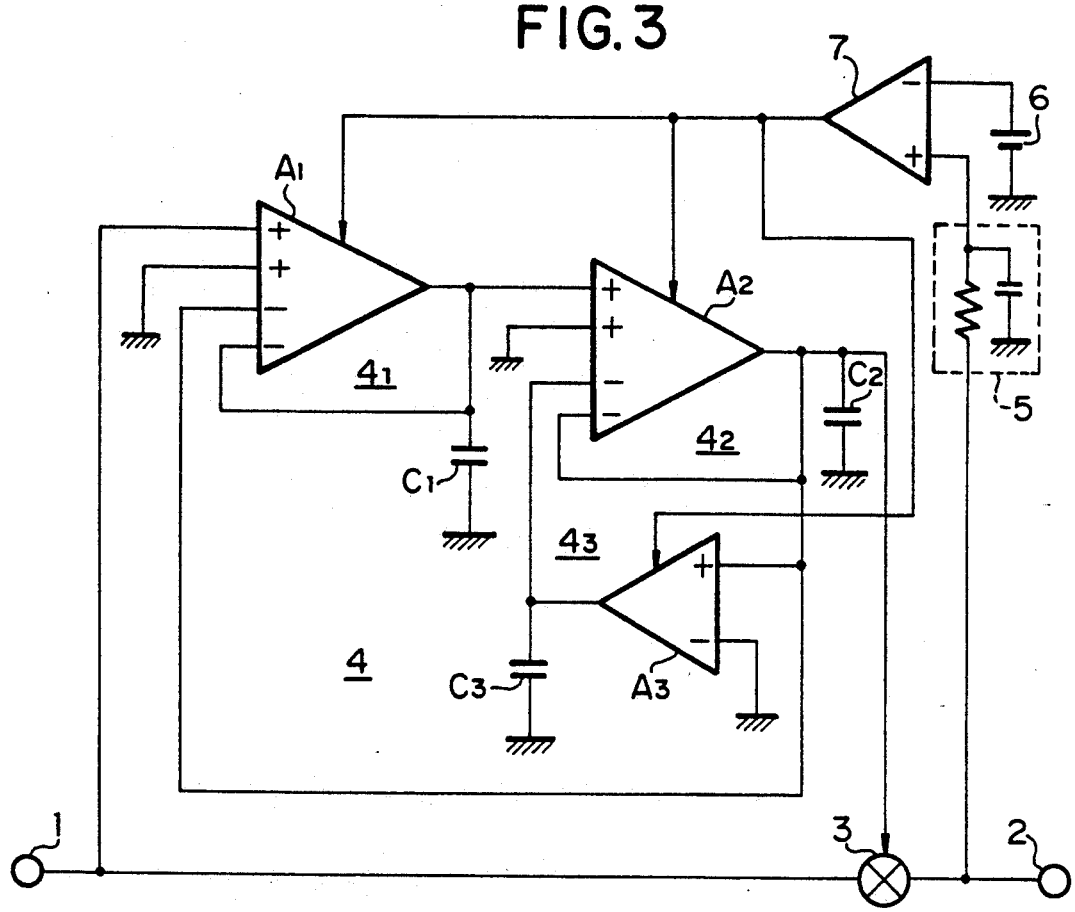
FIG. 3 is a circuit diagram showing an example of the FM detector circuit according to the present invention.

FIG. 2 is a block diagram showing the FM detector circuit according to an embodiment of the present invention, and FIG. 3 is a circuit diagram illustrating an example of the present FM detector circuit.

In FIG. 2, the reference numeral 1 indicates an input terminal to which is applied a limiter output provided by a limiter circuit. The limiter output in turn is supplied to a multiplier circuit 3, and a phase-shifting circuit 4 for causing the phase of the limiter signal to be shifted through 90 degrees at the center frequency, and the signal which has been phase-shifted through 90 degrees is supplied from the phase-shifting circuit 4 to the multiplier circuit 3. Detection output derived from the multiplier circuit 3 is supplied, via a smoothing circuit 5 comprising a capacitor and resistor, to an error amplifier 7 to which the reference voltage is applied from a reference voltage source 6. An error voltage derived from the error amplifier is applied to the phase-shifting circuit 4 so that the DC level of the FM detector circuit is controlled to be constant with respect to the center frequency independently of the tuning frequency. Indicated at 2 is an output terminal at which FM detection output is obtained.

With reference to FIG. 3, the FM detector circuit of the present invention will be described on the basis of an example thereof which is more concrete than FIG. 2. In FIG. 3, parts similar to those of FIG. 2 is indicated by like reference numerals or symbols.

The phase-shifting circuit 4 is constituted by an active filter comprising a plurality of integrating circuits which comprise transconductance amplifiers $A_1$ to $A_3$ and capacitors $C_1$ to $C_3$. The transconductance amplifier $A_1$, which is of the self negative feedback type, constitutes an integrating circuit $4_1$ with a capacitor $C_1$ connected between an output terminal thereof and the ground, wherein one positive input terminal thereof is connected to the input terminal 1, and another positive input terminal thereof is grounded. The output terminal of the integrating circuit $4_1$ is connected to one positive input terminal of the self negative feedback type transconductance amplifier $A_2$ which constitutes the an integrating circuit $4_2$ with a capacitor $C_2$ connected to the output terminal thereof. The output terminal of the integrating circuit $4_2$ is connected to one inverting input terminal of the transconductance amplifier $A_1$ and also to the positive input terminal of the transconductance amplifier $A_3$ which constitutes an integrating circuit $4_3$ with a capacitor $C_3$ connected to the output terminal thereof. The output terminal of the integrating circuit $4_3$ is connected to one inverting input terminal of the transconductance amplifier $4_2$. The integrating circuits $A_2$ and $4_3$ constitute a band pass filter (referred to as BPF hereinafter).

Limiter signal is supplied from the input terminal 1 to the positive input terminal of the transconductance amplifier $A_1$ and also to the multiplier circuit 3. The output of the phase-shifting circuit 4 is derived from the output terminal of the integrating circuit $4_2$ and supplied to another input terminal of the multiplier circuit 3. Thus, the limiter signal is subjected to phase-detection.

Detection output is supplied to a smoothing circuit 5, and passed to the positive input terminal of an error amplifier 7 after having been smoothed out in the smoothing circuit 5. An error voltage corresponding to the detection output is applied to the integrating circuits $4_1$ to $4_3$ through the error amplifier 7. In this way, the DC level of the detection output is automatically controlled so as to be maintained all the time at a value that remains constant with respect to the center frequency even if the tuning frequency is changed.

Figure 4:
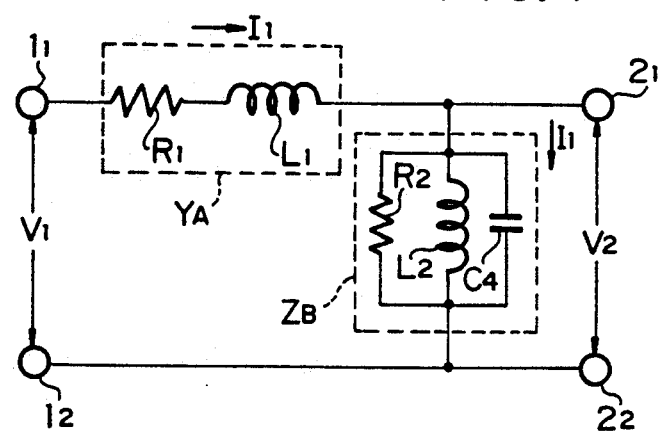
FIG. 4 is a circuit diagram of a common phase-shifting circuit.

With reference to FIGS. 4 to 8, it will be explained that a phase-shifting circuit using coils, a capacitor, and resistors such as shown in FIG. 4 can be substituted with the phase-shifting circuit of the FM detector circuit according to the present invention.

In the phase-shifting circuit of FIG. 4, a series circuit $Y_A$ comprising a resistor $R_1$ and coil $L_1$ is between input and output terminals $1_1$ and $2_1$, and a parallel circuit $Z_B$ comprising a resistor $R_2$, coil $L_2$ and capacitor $C_4$ is connected between the output terminals $2_1$ and $2_2$. Input voltage $V_1$ is applied between the input terminals $1_1$ and $1_2$, and output voltage $V_2$ is derived from between the output terminals $2_1$ and $2_2$. With the resistors $R_1$ and $R_2$ of the phase-shifting circuit being normalized and regarded as unity, the transfer functions of the series circuit $Y_A$ and parallel circuit $Z_B$ are given as follows:

$$Y_1(s) = 1/(1 + sL_1) \ldots \quad (1)$$

$$Z_1(s) = 1/(1 + sC_4 + 1/sL_2) \ldots \quad (2)$$

where $Y_1(s)$ and $Z_1(s)$ in the above equations (1) and (2) represent the transfer functions of the series circuit $Y_A$ and parallel circuit $Z_B$ respectively. By letting $P_1 = 1/L_1$, $P_2 = 1/C_4$ and $P_3 = 1/L_2$, the equations (1) and (2) can be rewritten as follows:

$$Y_1(s) = P_1/(s + P_1) \ldots \quad (3)$$

$$Z_1(s) = sP_2/(s^2 + sP_2 + P_2P_3) \ldots \quad (4)$$

The equation (3) represents the transfer function of the integrating circuit, and the equation (4) indicates the transfer function of the BPF.

In FIG. 4, assuming that the admittance of the series circuit $Y_A$ and the impedance of the series circuit $Z_B$ are $Y_1$ and $Z_1$ respectively and that current flowing therethrough is $I_1$, the relationship between the current $I_1$ and output voltage $V_2$ is as shown by the following equations (5) and (6):

$$I_1 = Y_1(V_1 - V_2) \ldots \quad (5)$$

$$V_2 = Z_1 I_1 \ldots \quad (6)$$

Figure 5:
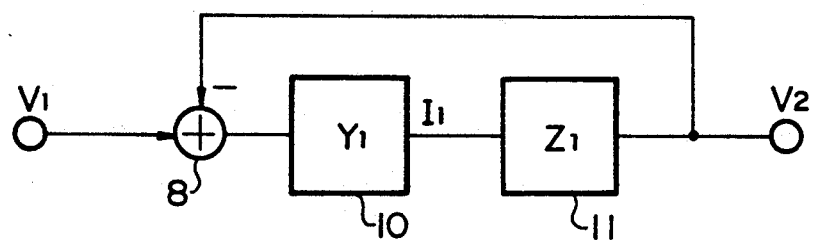
FIG. 5 is a signal diagram useful for explaining the phase-shifting circuit incorporated in the FM detector circuit according to the present invention.

Such a signal diagram as shown in FIG. 5 can be obtained on the basis of the above equations (5) and (6). In FIG. 5, the transfer function for the admittance $Y_1$ is $Y_1(s)$, and the transfer function for the impedance $Z_1$ is $Z_1(s)$. Indicated at 8 is an adder.

As mentioned above, $Y_1(s)$ is the transfer function for the integrating circuit, and $Z_1(s)$ is the transfer function for the BPF; thus, it will readily be apparent that in FIG. 5, the reference numeral 10 indicates the integrating circuit and 11 denotes the BPF.

Figure 6:
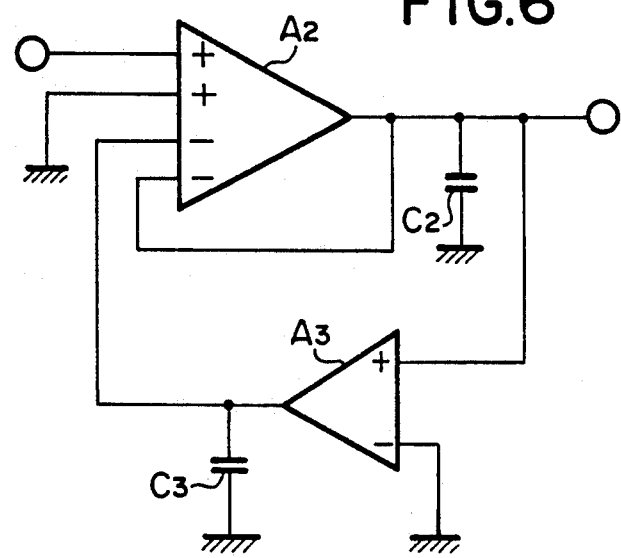
FIG. 6 is a circuit diagram showing a band pass filter (BPF) for the phase-shifting circuit incorporated in the FM detector circuit according to the present invention.
Figure 7:
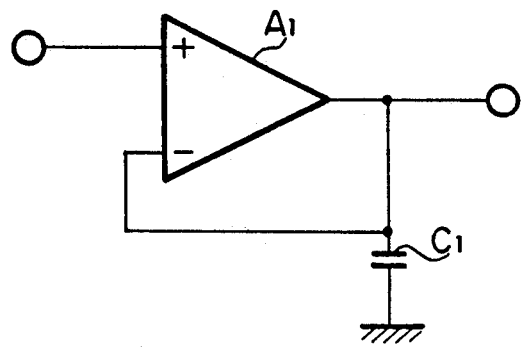
FIG. 7 is a circuit diagram showing the integrating circuit for the phase-shifting circuit incorporated in the FM detector circuit according to the present invention.

The integrating circuit 10 and BPF can be realized as such circuits as shown in FIGS. 7 and 6 respectively.

The circuit arrangement shown in FIG. 6 comprises an integrating circuit which is constituted by a transconductance amplifier $A_2$ arranged in the form of a self negative feedback circuit and a capacitor $C_2$ connected to the output terminal thereof; and another integrating circuit which is formed by a transconductance amplifier $A_3$ having its positive input terminal connected to the output terminal of the transconductance amplifier $A_2$, and a capacitor $C_3$ connected to the output terminal of the transconductance amplifier $A_3$ which is coupled to the inverting input terminal of the transconductance amplifier $A_2$. The BPF shown in FIG. 6 corresponds to that circuit portion which comprises the integrating circuits $4_2$ and $4_3$ in FIG. 3.

FIG. 7 illustrates an integrating circuit which comprises a transconductance amplifier $A_1$ arranged in the form of a self negative feedback circuit and a capacitor $C_1$ connected to the output terminal thereof, and which corresponds to the integrating circuit $4_1$ shown in FIG. 3. In FIG. 3, the transconductance amplifier $A_1$ has four input terminals, and the integrating circuit $4_1$ is a 4-input integrating circuit.

Figure 8:
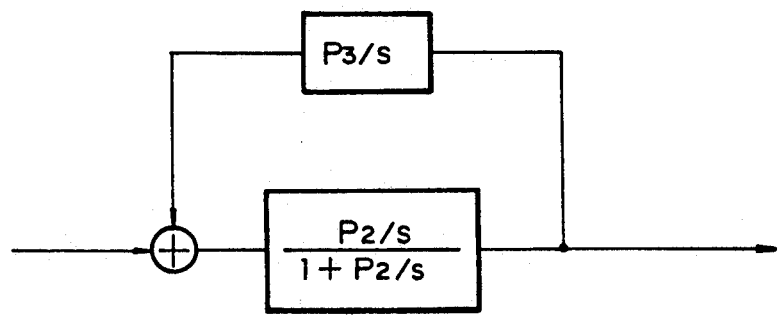
FIG. 8 is a signal diagram of the band pass filter.

FIG. 8 illustrates a signal diagram for the circuit shown in FIG. 6.

In FIG. 8, $P_2 = gm_2/C_2$, and $P_3 = gm_3/C_3$, wherein $gm_2$ is the transconductance of the transconductance amplifier $A_2$, and $gm_3$ is the transconductance of the transconductance amplifier $A_3$.

Figure 9:
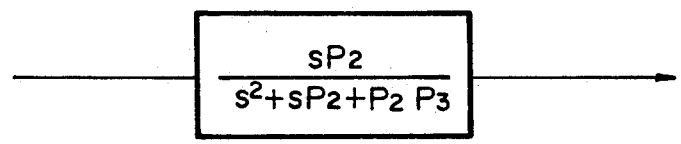
FIG. 9 is a signal diagram of the integrating circuit.

The signal diagram of FIG. 8 is degenerated into that of FIG. 9 which is represented by using the same transfer function as the equation (4). This means that the BPF 11 of FIG. 5 can be substituted with the BPF circuit of FIG. 6.

The transfer function for the integrating circuit shown in FIG. 7 is represented as $(P_1/s)/\{1+(P_1/s)\}$, where $P_1 = gm_1/C_1$, and $gm_1$ is the transconductance of the transconductance amplifier $A_1$. This transfer function is identical with the equation (3), which means that the integrating circuit 10 of FIG. 5 can be substituted with that of FIG. 7.

Figure 10:
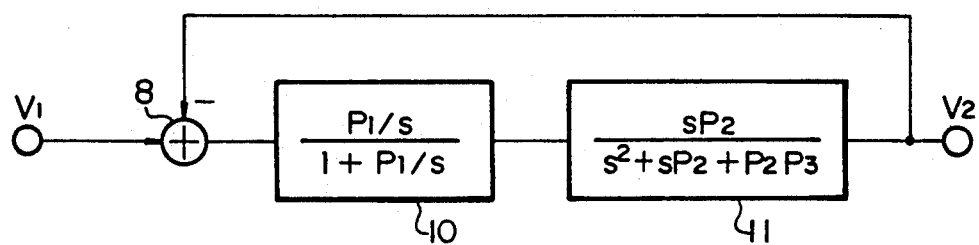
FIG. 10 is another signal diagram useful for explaining the phase-shifting circuit of the FM detector circuit according to the present invention.

The signal diagram of FIG. 5 can be transformed to that of FIG. 10. Adder 8 and integrating circuit 10 shown in FIG. 10 can be realized as a single integrating circuit by using a 4-input integrator.

By forming the impedance $Z_1$ by the circuit of FIG. 6, and also by constituting the admittance $Y_1$ and adder 8 by 4-input integrator, it is possible to the circuit of FIG. 3 which is equivalent to FIG. 4. This indicates that the phase-shifting circuit 4 can be constituted by the use of integrating circuit and BPF. Furthermore, by virtue of the fact that operating currents of the transconductance amplifiers A1, A2 and A3 of the phase-shifting circuit 4 are supplied through the error amplifier 7, the DC level of FM detection output can be controlled to be constant at the center frequency independently of the tuning frequency.

While the present invention has been illustrated and described with respect to specific embodiments thereof, it is to be understood that the present invention is by no means limited thereto but encompasses all changes and modifications which will become possible within the scope of the appended claims.

We claim:

1. An FM detector circuit comprising a phase-shifting circuit constituted by three integrating circuits each consisting of a transconductance amplifier and capacitor, said phase-shifting circuit being arranged to cause an output signal of a limiter incorporated in a FM receiver to be phase-shifted by 90 degrees at a center frequency of said output signal, said phase-shifting circuit also forming a band pass; a multiplying circuit adapted to receive said output signal of said limiter and an output signal from said phase-shifting circuit, thereby effecting phase-detection of said filter output signal of said limiter; and an error amplifier which is provided with a smoothed version of an output signal derived from said multiplying circuit, wherein output of said error amplifier is applied to said transconductance amplifiers constituting said phase-shifting circuit.

2. An FM detector circuit comprising a phase-shifting circuit arranged to cause output signal of a limiter incorporated in an FM receiver to be phase-shifted by 90 degrees at the center frequency thereof and forming a band pass filter; a multiplying circuit arranged to be effect phase-detection of the output signal of said limiter; and an error amplifier which is provided with a smoothed version of output signal derived from said multiplying circuit; said phase-shifting circuit comprising a first integrating circuit consisting of a first transconductance amplifier which is provided with the output signal of said limiter, and a first capacitor; a second integrating circuit consisting of a second transconductance amplifier which is provided with output of said first integrating circuit, and a second capacitor; and a third integrating circuit consisting of a third transconductance amplifier for providing negative feedback to said second integrating circuit, and a third capacitor wherein each of said first and second integrating circuits is of the self negative feedback type, and the output of said second integrating circuit is negatively fed back to said first integrating circuit; and output of said error amplifier is supplied to said transconductance amplifiers consisting said phase-shifting circuit.

* * * * *